United States Patent
Winkel et al.

(10) Patent No.: US 6,496,371 B2
(45) Date of Patent: Dec. 17, 2002

(54) HEAT SINK MOUNTING METHOD AND APPARATUS

(75) Inventors: Casey R. Winkel, Olympia, WA (US); Michael Z. Eckblad, Auburn, WA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/820,897

(22) Filed: Mar. 30, 2001

(65) Prior Publication Data

US 2002/0141157 A1 Oct. 3, 2002

(51) Int. Cl.[7] .................................................. H05K 7/20
(52) U.S. Cl. .................... 361/703; 29/890.03; 248/510; 257/719; 361/719
(58) Field of Search ................................ 248/505, 510; 267/150, 158, 160; 24/453, 457, 458, 625, 588, 589; 257/722, 718, 719, 726, 727; 165/80.3, 185; 174/16.3; 361/703–705, 709–712, 717–719; 29/890.03, 515

(56) References Cited

U.S. PATENT DOCUMENTS

| | | |
|---|---|---|
| 4,388,967 A | 6/1983 | Breese |
| D269,606 S | 7/1983 | Jordan et al. |
| 4,509,839 A * | 4/1985 | Lavochkin .................. 257/718 |
| 4,575,038 A | 3/1986 | Moore |
| 4,609,040 A | 9/1986 | Moore |
| 4,625,260 A | 11/1986 | Jordan et al. |
| 4,709,302 A | 11/1987 | Jordan et al. |
| 4,712,159 A | 12/1987 | Clemens |
| 4,729,426 A | 3/1988 | Hinshaw |
| 4,745,456 A | 5/1988 | Clemens |
| 4,847,449 A | 7/1989 | Jordan et al. |
| 4,890,196 A | 12/1989 | Hinshaw |
| 4,961,125 A | 10/1990 | Jordan et al. |
| 5,019,940 A | 5/1991 | Clemens |
| 5,019,942 A | 5/1991 | Clemens |
| 5,068,764 A | 11/1991 | Bland et al. |
| 5,130,888 A | 7/1992 | Moore |
| 5,138,524 A | 8/1992 | Smithers |
| 5,208,731 A | 5/1993 | Blomquist |
| 5,276,585 A | 1/1994 | Smithers |
| 5,365,654 A | 11/1994 | Moulton |
| 5,371,652 A | 12/1994 | Clemens et al. |
| 5,386,338 A | 1/1995 | Jordan et al. |
| D357,227 S | 4/1995 | Smithers |
| 5,428,897 A | 7/1995 | Jordan et al. |
| 5,464,054 A | 11/1995 | Hinshaw et al. |
| 5,466,970 A | 11/1995 | Smithers |
| 5,566,749 A | 10/1996 | Jordan et al. |
| 5,590,025 A | 12/1996 | Clemens |
| 5,594,624 A | 1/1997 | Clemens et al. |
| 5,615,735 A * | 4/1997 | Yoshida et al. ............ 165/80.3 |
| 5,640,305 A | 6/1997 | Smithers |
| RE35,573 E | 7/1997 | Clemens |
| 5,677,829 A | 10/1997 | Clemens |
| 5,844,312 A | 12/1998 | Hinshaw et al. |
| 5,847,928 A | 12/1998 | Hinshaw et al. |
| 5,889,653 A | 3/1999 | Clemens et al. |
| 5,903,977 A | 5/1999 | Fisher et al. |
| 5,917,700 A | 6/1999 | Clemens et al. |
| 5,930,114 A | 7/1999 | Kuzmin et al. |
| 5,991,154 A | 11/1999 | Clemens et al. |
| 6,082,440 A | 7/2000 | Clemens et al. |
| 6,115,253 A | 9/2000 | Clemens et al. |
| 6,118,657 A | 9/2000 | Clemens |
| 6,295,203 B1 * | 9/2001 | Lo ............................. 361/704 |

* cited by examiner

*Primary Examiner*—Gerald Tolin
(74) *Attorney, Agent, or Firm*—Antonelli, Terry, Stout & Kraus, LLP

(57) ABSTRACT

A method and apparatus for safely and quickly mounting a heat sink in heat conducting relation with an electronic component on a supporting member such as a printed circuit board, allow sequential assembly of the heat sink and a wire clip for mounting the heat sink on the supporting member in a manner which reduces the possibility of damaging the electronic component or components on the supporting member. A load centering part is arranged between an elongated central portion of the wire clip and the heat sink to help locate the clip force on the heat sink generally opposite the electronic component without retaining the central portion of the mounting device on the heat sink.

20 Claims, 3 Drawing Sheets

HEAT SINK MOUNTING METHOD AND APPARATUS

FIELD

The present invention is directed to an apparatus and method for mounting a heat sink in heat conducting relation to an electronic component on a supporting member.

BACKGROUND

Various methods and apparatus are known for mounting a heat sink in heat conducting relation to an electronic component on a supporting member. For example, in one known method and apparatus as disclosed in U.S. Pat. No. 5,386,338, a heat sink attachment subassembly comprising a heat sink and a spring clamp which is secured to the heat sink by a clip, is formed. The subassembly in turn, is mounted on an electronic component.

It has been found by applicants that when mounting such a heat sink attachment subassembly on an electronic component on a supporting member, such as a printed circuit board, the manipulation of the subassembly necessary during mounting can cause damage to an exposed die or other electronic component on the board. It has also been found that the exposed die is susceptible to damage during shipping. There is a need for an improved method and apparatus for mounting a heat sink in heat conducting relation to an electronic component on a supporting member which permit the heat sink to be safely and quickly mounted in heat conducting relation with the electronic component while minimizing the likelihood of damage to the electronic component and adjacent electronic components on the supporting member, and which, at the same time, help locate the spring clamp force on the heat sink opposite the electronic component. The load locating addresses the physical damages susceptible during shock and vibration induced by user interaction and shipping and also maintains an even force distribution between the heat sink and die.

BRIEF DESCRIPTION OF THE DRAWINGS

The foregoing and a better understanding of the present invention will become apparent from the following detailed description of example embodiments and the claims when read in connection with the accompanying drawings, all forming a part of the disclosure of this invention. While the foregoing and following written and illustrated disclosure focuses on disclosing example embodiments of the invention, it should be clearly understood that the same is by way of illustration and example only and that the invention is not limited thereto. The spirit and scope of the present invention are limited only by the terms of the appended claims.

The following represents brief descriptions of the drawings, wherein.

DETAILED DESCRIPTION

Figure 2:
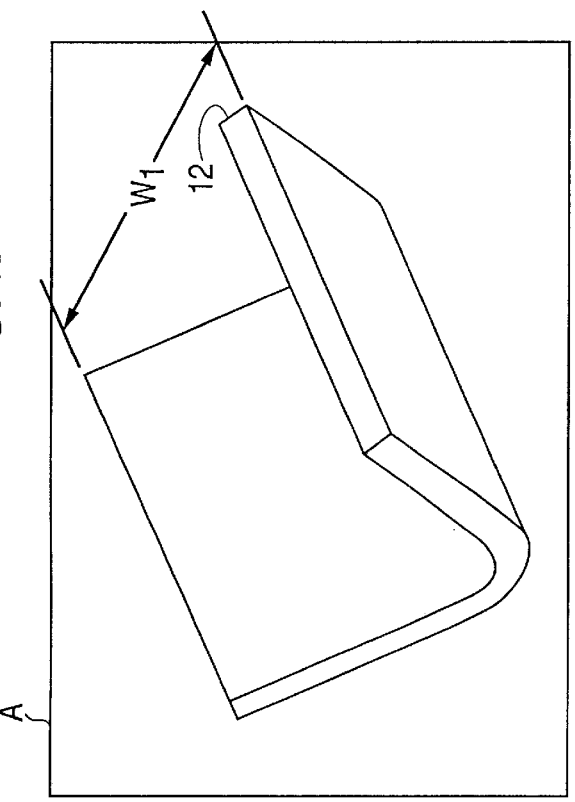
FIG. 2 is an enlarged, perspective view of the load centering part of the embodiment of FIG. 1, within the box A in FIG. 1, in the form of a metal load clip.

Before beginning a detailed description of the subject invention, mention of the following is in order. When appropriate, like reference numerals and characters may be used to designate identical, corresponding or similar components in differing figure drawings. Further, in the detailed description to follow, example sizes/models/values/ranges may be given, although the present invention is not limited to the same.

Figure 3:
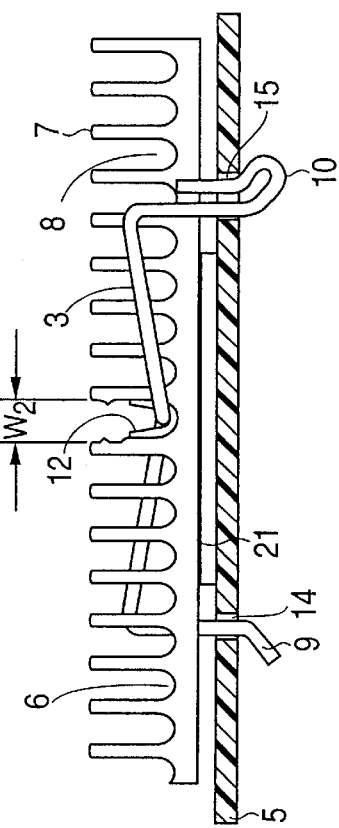
FIG. 3 is a side view of the embodiment of FIGS. 1 and 2 shown in relation to a schematically illustrated printed circuit board with electronic component on which the heat sink is mounted.
Figure 1:
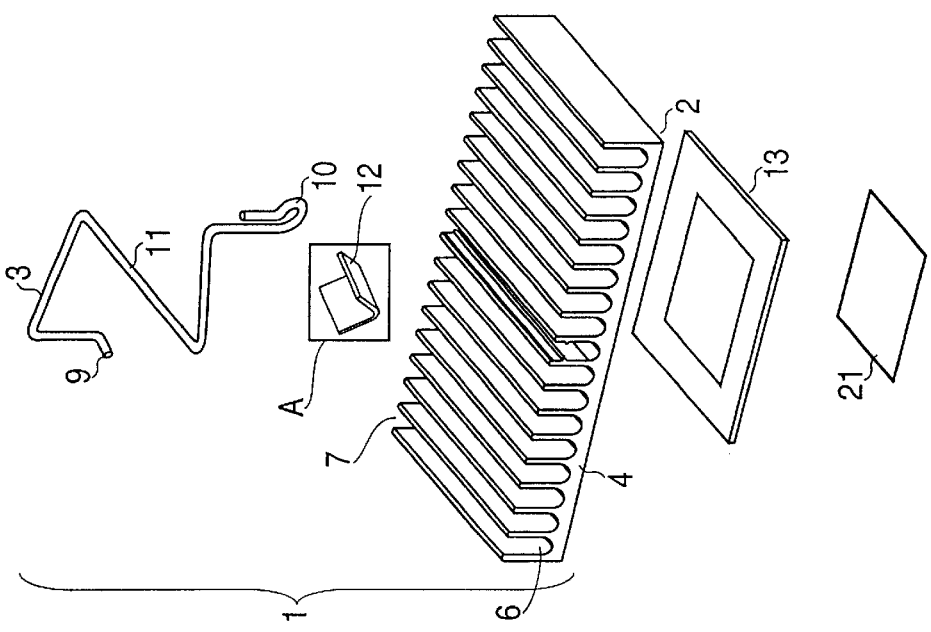
FIG. 1 is an exploded view of a first example embodiment of the invention with the parts thereof arranged one above the other prior to mounting the heat sink on an electronic component on a printed circuit board.

Referring now to FIGS. 1–3 of the drawings, an apparatus 1 according to a first example embodiment of the invention for dissipating heat from an electronic component on a supporting member comprises a heat sink 2, a mounting device 3 and a load centering part 12. The heat sink 2 has a first surface 4 adapted to be placed in heat conducting relation with an electronic component 21 on a supporting member 5, see FIG. 3. The supporting member 5 is a printed circuit board in the example embodiment. A second surface 6 of the heat sink on an opposite side of the heat sink from the first surface 4 has a plurality of outwardly projecting heat dissipating. members 7 in the form of fins spaced from one another.

The heat sink 2 in the example embodiment is formed of a thermally conductive metal, copper or aluminum, for example, which dissipates the heat generated by the electronic component into the surrounding environment. The first surface 4 of the heat sink in the example embodiment is flat for engaging the surface of the electronic component 21 in heat conducting relation, preferably by way of a thermally conducting layer, not shown, which could be applied as a one-part or a two-part adhesive system in either fluid or solid form. The thermally conducting layer could also be in the form of a double-sided tape, applied separately during assembly or furnished already attached on one side to either the component or the heat sink. The elongated fins 7 are arranged in parallel on the surface 6 of the heat sink to define grooves 8 therebetween for enhancing heat dissipation.

The mounting device 3 of the apparatus 1 is adapted to be attached at its respective ends 9 and 10 to the printed circuit board 5 as depicted in FIG. 3. The mounting device 3 has an elongated central portion 11 for extending over the second surface 6 of the heat sink 2 in a groove 8 between adjacent fins 7 and applying a load on the heat sink in the direction of the electronic component 21 which is located in thermally conducting relation with the heat sink surface 4 between the heat sink and the printed circuit board 5. The mounting device 3 is a wire spring clip in the example. embodiment.

The load centering part 12 of the apparatus 1 is arranged between the elongated central portion 11 of the mounting device 3 and the heat sink so as to locate the load applied by the mounting device on the heat sink opposite the center of the electronic component. The load centering part 12 is in the form of a metal load clip made of stainless steel, for example, and preferably having a thickness between approximately 0.01 and 0.05 inch. The load clip 12 is secured on the heat sink in a groove 8 between two adjacent fins 7. The width $w_1$, FIG. 2, of the load clip 12 at its upper, wider end, in the relaxed state before assembly on the heat sink, is wider than the width $w_2$, FIG. 3, of the groove 8 in which the load clip is to be inserted. Thus, upon insertion of the load clip, the outer, upper ends of the clip are resiliently biased inwardly against the side walls of the adjacent fins 7 to secure the load clip in position on the heat sink. Further, in this installed position of the load clip on the heat sink as shown in FIG. 3, the internal width of the outwardly facing opening of the load clip is greater than the diameter of the wire of the elongated central portion 11 of the mounting device. Therefore, the load clip mounted on the heat sink freely receives the elongated central portion of the mounting device for locating the load applied by the mounting device 3 opposite the electronic component 21 without retaining the central portion 11 on the heat sink.

The apparatus 1 of the invention helps locate the spring clip force on the heat sink opposite the electronic component after locating the heat sink over the electronic component on the printed circuit board. This sequence permits the heat sink to be safely and quickly mounted in heat conducting relation with the electronic component 21 on the board so as to minimize the likelihood of damage to electronic components on the board. The load centering part 12 is preferably positioned on the heat sink so that the force applied to the heat sink is centrally located above the electronic component. This position may or may not correspond to the center of the heat sink itself depending upon the shape of the heat sink and also on the relative positioning of the heat sink and the underlying electronic component to be cooled.

Thus, according to the method of the invention, the surface 4 of the heat sink 2 is first placed in heat conducting relation with the electronic component, located within optional gasket 13 above a support frame on the printed circuit board 5, as shown in FIGS. 1 and 3. The one end 9 of the mounting device 3 is thereafter inserted in a first means on the supporting member for retaining the end 9 of the mounting device on the supporting member. For this purpose, in the example embodiment, a hole 14 is located to one side of the electronic component for receiving the end 9 of the mounting member/spring clip 3. The wire spring clip 3 is not attached to the heat sink and can easily and safely be tilted or inclined to facilitate this connecting. The wire spring clip 3 is then pivoted relative to the hole 14 and the heat sink 2 so that its elongated central portion 11, extends over the surface 6 of the heat sink, in the groove 8 containing the load centering part 12. The second end 10 of the mounting device 3 is then inserted, using a tool, for example, into a second means, hole 15, in the printed circuit board on an opposite side of the circuit component from hole 14.

The spring clip 3, heat sink 2 and printed circuit board 5 are dimensioned so that with installation of both ends 9 and 10 of the mounting device 3 on the printed circuit board, a load is applied by the mounting device 3 on the heat sink 2 in the direction of the underlying electronic component 21 by way of the elongated central portion 11 of the mounting device 3. This sequential mounting of the heat sink and mounting device precludes having to tilt the heat sink during attachment of the mounting device which can lead to damage of the underlying electronic component 21 or adjacent electronic components on the printed circuit board as noted above. The invention also helps to locate the clip force on the heat sink opposite the electronic component which ensures the force is located above the electronic component, without retaining the central portion 11 of the mounting device on the heat sink with the load centering part.

Figure 4:
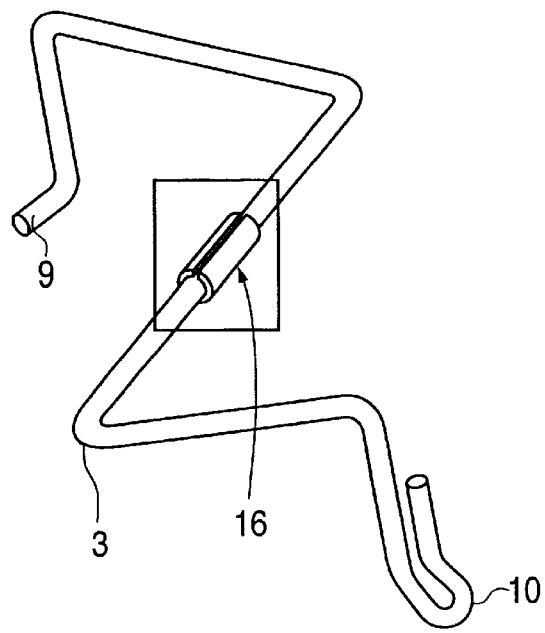
FIG. 4 is a view from above and to one side of a two part heat sink clip assembly to locate the wire clip load according to a second embodiment of the invention.
Figure 5:
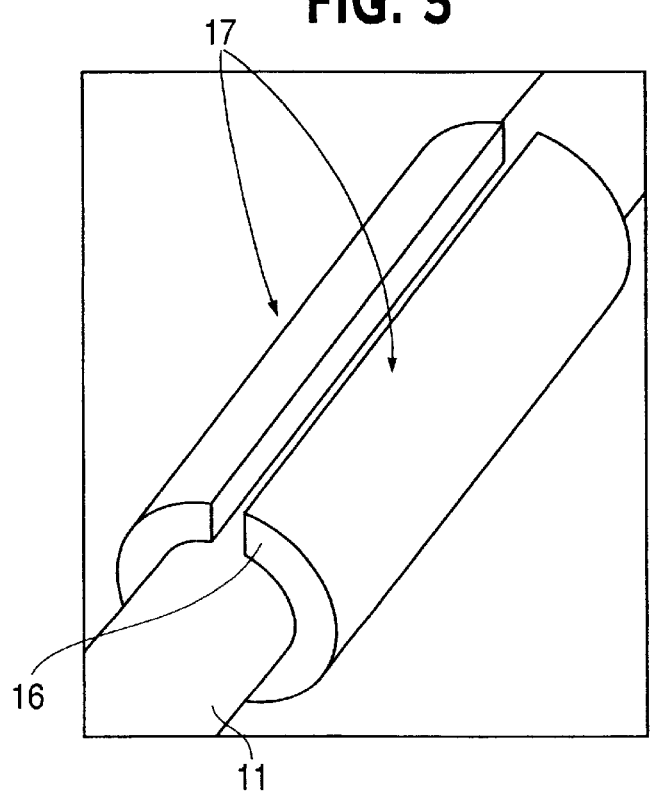
FIG. 5 is an enlarged view of the portion of FIG. 4 within the box, showing the location of crimps joining the load centering part to the heat sink wire clip.

The method of the example embodiment of FIGS. 1–3 includes the step of arranging the load centering part 12 by securing the load clip in a groove 8 between two fins 7. This is preferably accomplished before placing the first surface 4 of the heat sink 2 in heat conducting relation with the electronic component 21 on the supporting member 5, but could be performed after positioning the heat sink on the electronic component prior to applying the clamping load to the heat sink with the mounting device 3. According to a second example embodiment of the invention as illustrated in FIGS. 4 and 5, the load centering part 16 is in the form of a metal clip made of stainless steel, for example, preferably between approximately 0.01 and 0.05 inch thick, which is assembled on the elongated central portion 11 of the mounting member 3 creating a two-piece assembly. The load centering part 16 is held in place by crimping it to the wire spring clip 3 at the locations 17, see FIG. 5. When assembled to the mounting device 3, the load centering part 16 is dimensioned so that it is freely received, e.g., with clearance, between the two fins 7 in the groove 8 for centering the applied load without retaining the central portion of the mounting device between the fins 7 on the heat sink.

Figure 7:
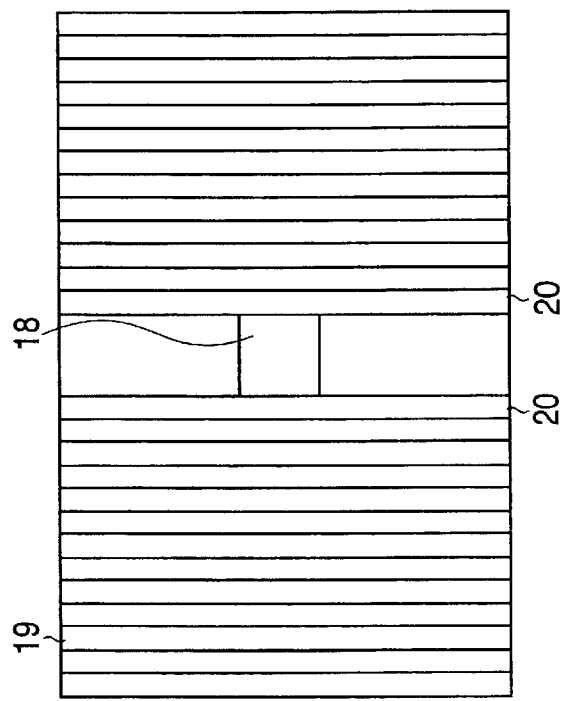
FIG. 7 is a top view of a heat sink with a rubber load centering part press fit between fins of the heat sink according to the third example embodiment of FIG. 6.
Figure 6:
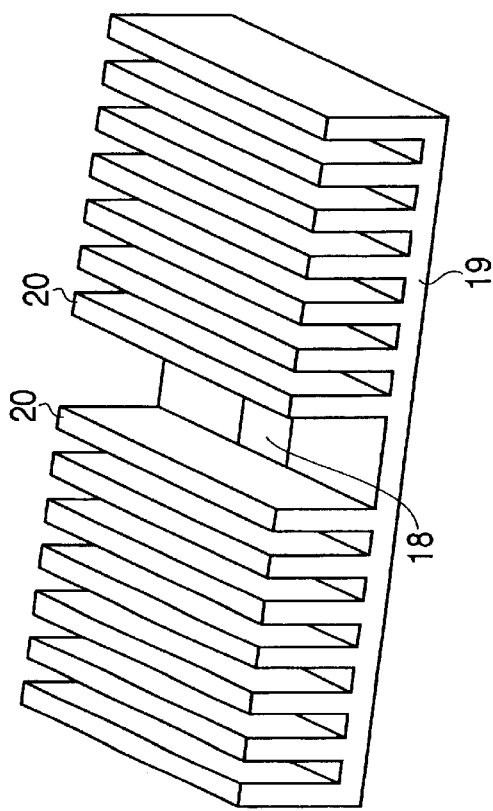
FIG. 6 is a perspective view from above and to the right side of a heat sink with a rubber load centering part press fit between fins at a location of the heat sink opposite the electronic component according to a third example embodiment of the invention.
Figure 8:
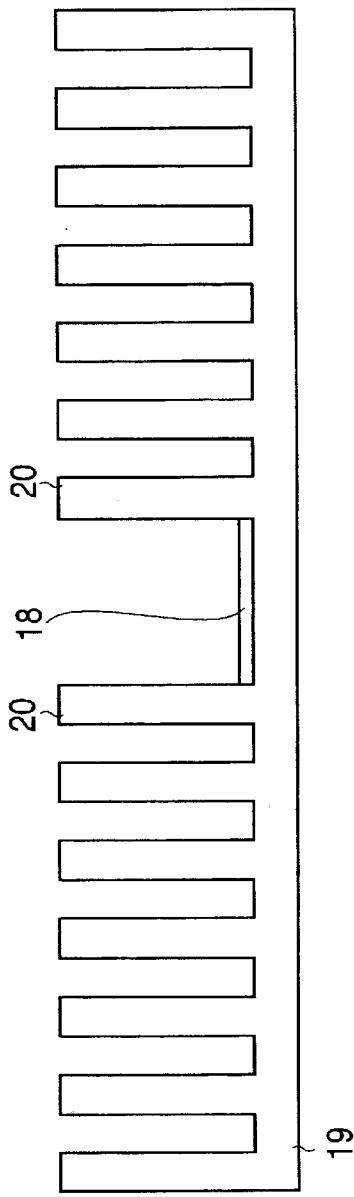
FIG. 8 is a front side view of the heat sink with rubber load centering part of FIG. 7.

A third example embodiment according to the invention is represented in FIGS. 6–8, wherein a load centering part in the form of a compressible rubber member 18 is press-fitted onto the heat sink 19 between two adjacent fins 20 in a location which will be opposite the electronic component to be cooled. The load centering part 18 is a pre-formed compressible rubber stopper, preferably between approximately 0.01 and 0.05 inch thick, or a dab of silicon (or other material) rubber that can harden in place. The part 18 is pressed into the load center of the heat sink 19 where it is retained. With this part in place, the heat sink retention force applied by the central portion 11 of the mounting device 3, which is received with clearance between two adjacent fins 20, will preferably be located opposite the center of the electronic component. This advantage is obtained by each of the example embodiments of the invention disclosed herein, while at the same time not requiring the simultaneous mounting of a subassembly comprising both a heat sink and a mounting device on an electronic component on a supporting member whereby damage to an exposed die or other electronic component on the board during assembly can be reduced.

While we have shown and described only three example embodiments of the present invention herein, it will be readily understood by the skilled artisan that variations in the method and apparatus of the invention are possible without departing from the scope of our invention. For example, other designs and materials could be employed for the heat sink, the load centering part and the mounting device while still retaining the advantages of the invention. The first and second means on the printed circuit board for retaining the respective ends of the mounting device are holes in the printed circuit board in the example embodiments, but other known anchor constructions for these ends could be employed as will be understood by the skilled artisan. Therefore, we do not wish to be limited to the details shown and described herein, but intend to cover all such changes and modifications as are encompassed by the scope of the appended claims.

We claim:

1. An apparatus for dissipating heat from an electronic component on a supporting member, the apparatus comprising:

a heat sink having a first surface in heat conducting relation with an electronic component on a supporting member and a second surface on an opposite side of the heat sink from the first surface;

a mounting device attached to the supporting member and having an elongated central portion extending over the second surface of the heat sink and applying a load on the heat sink in the direction of the electronic component; and a load centering part arranged between the elongated central portion of the mounting device and the heat sink locating the load applied by the mounting device on the heat sink opposite the electronic component, the load centering part having a load supporting surface with an outwardly facing opening which is always larger than a width of the central portion of the mounting device on the heat sink so as not to retain the central portion on the heat sink.

2. The apparatus according to claim 1, wherein the second surface of the heat sink has at least two outwardly projecting heat dissipating members spaced from one another, the load centering part is a load clip secured between two of the heat dissipating members on the heat sink and presenting said outwardly facing opening, the opening freely receiving the elongated central portion of the mounting device therein to locate the load opposite the electronic component without retaining the central portion on the heat sink.

3. The apparatus according to claim 2, wherein the heat dissipating members are fins.

4. The apparatus according to claim 2, wherein the load clip is formed of metal.

5. The apparatus according to claim 1, wherein spaced, outwardly projecting heat dissipating members are provided on the second surface of the heat sink, the elongated central portion of the mounting device extends with clearance between two adjacent ones of the heat dissipating members, and respective ends of the mounting device are attached to the supporting member.

6. The apparatus according to claim 5, wherein the supporting member is a printed circuit board.

7. The apparatus according to claim 1, wherein the mounting device is a wire clip.

8. The apparatus according to claim 1, wherein the supporting member is a printed circuit board.

9. An apparatus for dissipating heat from an electronic component on a supporting member, the apparatus comprising:

a heat sink having a first surface in heat conducting relation with an electronic component on a supporting member and a second surface on an opposite side of the heat sink from the first surface;

a mounting device attached to the supporting member and having an elongated central portion extending over the second surface of the heat sink and applying a load on the heat sink in the direction of the electronic component; and a load centering part arranged between the elongated central portion of the mounting device and the heat sink locating the load applied by the mounting device on the heat sink opposite the electronic component, wherein the load centering part is secured to the elongated central portion of the mounting device and is always freely received with clearance at the heat sink between two outwardly projecting heat dissipating members on the second surface of the heat sink so as not to retain the central portion of the mounting device on the heat sink.

10. The apparatus according to claim 9, wherein the load centering part is formed of metal and is crimped onto the elongated central portion of the mounting device.

11. An apparatus for dissipating heat from an electronic component on a supporting member, the apparatus comprising:

a heat sink having a first surface in heat conducting relation with an electronic component on a supporting member and a second surface on an opposite side of the heat sink from the first surface;

a mounting device attached to the supporting member and having an elongated central portion extending over the second surface of the heat sink and applying a load on the heat sink in the direction of the electronic component; and a load centering part arranged between the elongated central portion of the mounting device and the heat sink locating the load applied by the mounting device on the heat sink opposite the electronic component, wherein the load centering part is a compressible rubber member which is press-fitted onto the heat sink between two outwardly projecting heat dissipating members on the second surface of the heat sink, the load centering part having a load supporting surface which together with said two outwardly projecting heat dissipating members form an opening which is always larger than a width of the elongated central portion of the mounting device so as not to retain the central portion on the heat sink.

12. A method of mounting a heat sink to an electronic component on a supporting member, the method comprising:

placing a first surface of the heat sink in heat conducting relation with the electronic component;

inserting one end of a heat sink mounting device in first means on the supporting member for retaining the one end of the mounting device on the supporting member;

pivoting the mounting device relative to the first means and the heat sink so that an elongated central portion of the mounting device extends over a second surface of the heat sink on an opposite side of the heat sink from the first surface;

inserting a second end of the mounting device in second means on the supporting member for retaining the second end of the mounting device on the supporting member and applying a load on the heat sink in the direction of the electronic component by way of the elongated central portion of the mounting device; and wherein the method includes arranging a load centering part between the elongated central portion of the mounting device and the heat sink for locating the load applied by the mounting device on the heat sink opposite the electronic component, and wherein the elongated central portion of the mounting device is always received with clearance on the heat sink so as not to be retained thereon.

13. The method according to claim 12, wherein the arranging of the load centering part includes securing a load clip at the heat sink between two adjacent heat dissipating members, the load clip having an internal width greater than that of the elongated central portion for freely receiving the elongated central portion of the mounting device for locating the load opposite the electronic component without retaining the central portion on the heat sink.

14. The method according to claim 12, wherein the arranging of the load centering part includes crimping a metal load centering part onto the elongated central portion of the mounting device, the load centering part being freely received with clearance between the two heat dissipating members for locating the load opposite the electronic component without retaining the central portion on the heat sink.

15. The method according to claim 12, wherein the arranging of the load centering part includes press-fitting a compressible rubber member onto the heat sink between two adjacent heat dissipating members, the elongated central portion of the mounting device engaging the rubber member so that the applied load on the heat sink is located opposite the electronic component without retaining the central portion on the heat sink.

16. The method according to claim 12, wherein the supporting member is a printed circuit board and the first and second means thereon are respective holes in the printed circuit board in which the ends of the mounting device are inserted.

17. An apparatus for dissipating heat from an electronic component on a supporting member, the apparatus comprising:

a heat sink comprising a body of thermally conductive material having a first surface on one side of the body for arrangement in heat conducting relation with an electronic component to be cooled, and a second surface on an opposite side of the body, the second surface having at least two outwardly projecting heat dissipating members spaced from one another;

a mounting device having an elongated central portion for applying a load on the second surface of the heat sink in the direction of an electronic component arranged in heat conducting relation with the first surface; and a load centering part which can be arranged between the elongated central portion of the mounting device and the second surface of the heat sink to locate a load applied by the elongated central portion of the mounting device opposite an electronic component arranged in heat conducting relation with the first surface of the heat sink, the heat sink, load centering part and elongated central portion of the mounting device being dimensioned so that the central portion of the mounting device is always received with clearance on the heat sink so as not to be retained thereon.

18. The apparatus according to claim 17, wherein the load centering part is a load clip which can be secured between two of the outwardly projecting heat dissipating members spaced from one another on the heat sink, the load clip when secured on the heat sink having an outwardly facing opening with an internal width greater the width of the elongated central portion of the mounting device for freely receiving the elongated central portion of the mounting device to locate the load opposite the electronic component without retaining the central portion on the heat sink.

19. The apparatus according to claim 17, wherein the load centering part is a metal sleeve which is crimped onto the elongated central portion and is freely receivable with clearance on the heat sink between two fins.

20. The apparatus according to claim 17, wherein the load centering part is a compressible rubber member which is press-fitted onto the heat sink between two fins.

* * * * *